(12) United States Patent
Voegeli et al.

(10) Patent No.: US 7,532,142 B1
(45) Date of Patent: May 12, 2009

(54) STRUCTURES FOR SYSTEMS AND METHODS OF GENERATING AN ANALOG SIGNAL

(75) Inventors: Benjamin Thomas Voegeli, Chittenden, VT (US); Bradford Hunter, Chittenden, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/139,318

(22) Filed: Jun. 13, 2008

(51) Int. Cl.
 *H03M 1/78* (2006.01)
(52) U.S. Cl. ........................ 341/154; 341/144; 341/145
(58) Field of Classification Search .................. 341/144, 341/145, 154
 See application file for complete search history.

(56) References Cited

U.S. PATENT DOCUMENTS

| | | | | |
|---|---|---|---|---|
| 5,059,978 A | | 10/1991 | Valdenaire | |
| 5,495,245 A | * | 2/1996 | Ashe | 341/145 |
| 5,703,588 A | * | 12/1997 | Rivoir et al. | 341/159 |
| 5,940,020 A | * | 8/1999 | Ho | 341/145 |
| 6,054,884 A | | 4/2000 | Lye | |
| 6,163,288 A | * | 12/2000 | Yoshizawa | 341/144 |
| 6,181,265 B1 | * | 1/2001 | Lee | 341/145 |
| 6,225,929 B1 | * | 5/2001 | Beck | 341/144 |
| 6,388,599 B2 | | 5/2002 | Yamamoto et al. | |
| 6,414,616 B1 | * | 7/2002 | Dempsey | 341/144 |
| 6,621,440 B2 | * | 9/2003 | Gorman | 341/154 |
| 6,724,336 B2 | * | 4/2004 | Leung et al. | 341/145 |
| 6,782,499 B2 | | 8/2004 | Osada et al. | |
| 6,885,328 B1 | * | 4/2005 | Kao et al. | 341/144 |
| 7,420,496 B2 | * | 9/2008 | Kim et al. | 341/145 |
| 7,453,385 B2 | * | 11/2008 | Hino | 341/145 |
| 2002/0030620 A1 | | 3/2002 | Cairns et al. | |
| 2002/0121995 A1 | * | 9/2002 | Tabler | 341/145 |

\* cited by examiner

*Primary Examiner*—Linh V Nguyen
(74) *Attorney, Agent, or Firm*—Jackson Patent Law Office

(57) ABSTRACT

A digital to analog converter (DAC) system includes a resistor network providing enhanced response time and steady state characteristics.

1 Claim, 16 Drawing Sheets

US 7,532,142 B1

STRUCTURES FOR SYSTEMS AND METHODS OF GENERATING AN ANALOG SIGNAL

BACKGROUND OF THE INVENTION

1. Field of the Invention

This invention relates generally to design structures for systems and methods of generating an analog signal and, more specifically, to design structures for systems and methods of converting a digital signal into an analog signal.

2. Description of Related Art

One type of digital to analog converter (DAC) employs a resistor ladder. The number of resistors in the ladder grows with an increasing number of bits into the incoming digital data. As the number of resistors grows, the total resistance of the network grows, increasing the RC time constant for charging and discharging to change the analog output as the digital input data changes. Thus, performance of the DAC is limited.

SUMMARY OF THE INVENTION

To address the problem above, there is a design structure embodied in a machine readable medium for designing, manufacturing, or testing, the design structure comprising a digital to analog converter on an integrated circuit. The digital to analog converter comprises an output node; a first plurality of resistors coupled in series to receive a first reference voltage and a second reference voltage, the first plurality of resistors having a first resistance; an array of first switches, each first switch being coupled between the output node and a respective resistor of the first plurality of resistors; a second plurality of resistors coupled in series to receive the first reference voltage and the second reference voltage, the second plurality of resistors having a resistance lower than the first resistance; a control unit including a resistor, the control unit configured to generate a pulse having a width that is an increasing function of the resistor value; and an array of second switches, each second switch having a control input responsive to the pulse, and a current path coupled between a respective node in the second plurality of resistors and a respective node in the first plurality of resistors, each respective node in the first plurality of resistors being configured to receive a voltage greater than the first reference voltage and less than the second reference voltages.

BRIEF DESCRIPTION OF THE DRAWINGS

References are made to the following text taken in connection with the accompanying drawings, in which.

The accompanying drawings which are incorporated in and which constitute a part of this specification, illustrate embodiments of the invention and, together with the description, explain the principles of the invention, and additional advantages thereof. Certain drawings are not necessarily to scale, and certain features may be shown larger than relative actual size to facilitate a more clear description of those features. Throughout the drawings, corresponding elements are labeled with corresponding reference numbers.

DETAILED DESCRIPTION OF EXEMPLARY SYSTEMS

Figure 1:
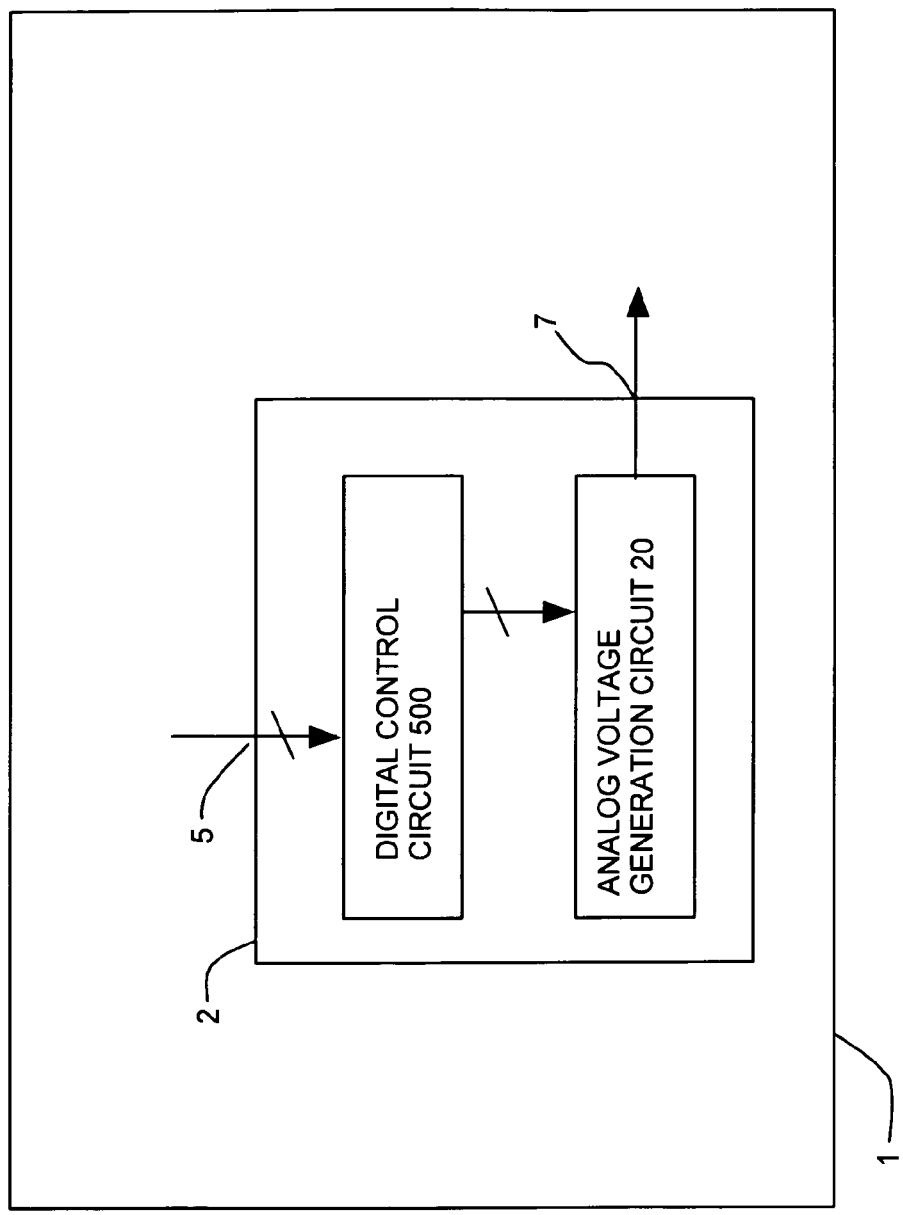
FIG. 1 shows an exemplary embodiment of the present invention.

FIG. 1 shows integrated circuit (IC) 1 on a common silicon substrate. IC 1 includes digital to analog circuit 2 having a multibit digital input 5 and an analog output 7. Digital control circuit 500 generates control signals and sends the control signals to voltage generation circuitry 20.

Figure 2:
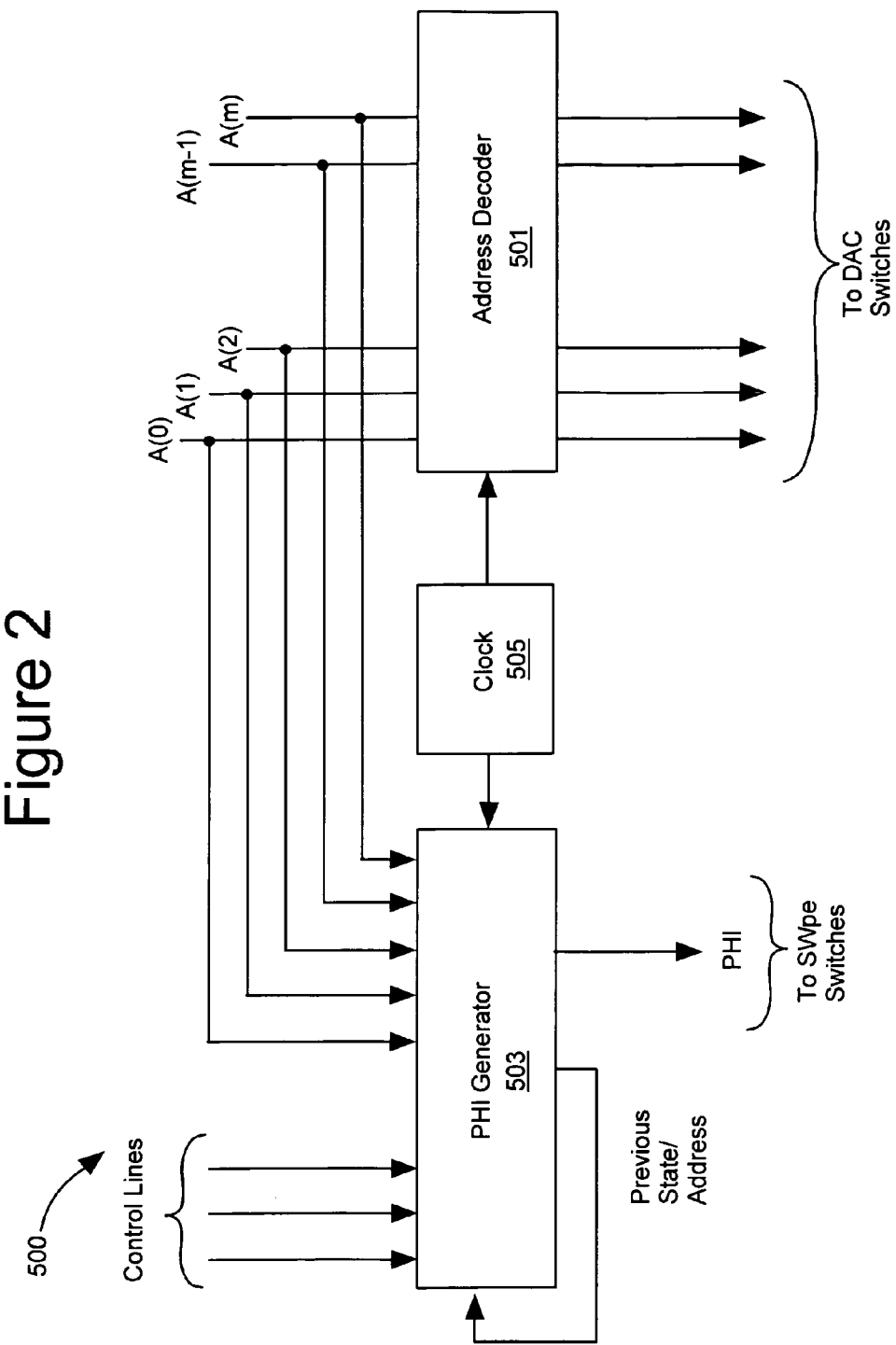
FIG. 2 shows digital control circuitry of the system of FIG. 1 in more detail.
Figure 3:
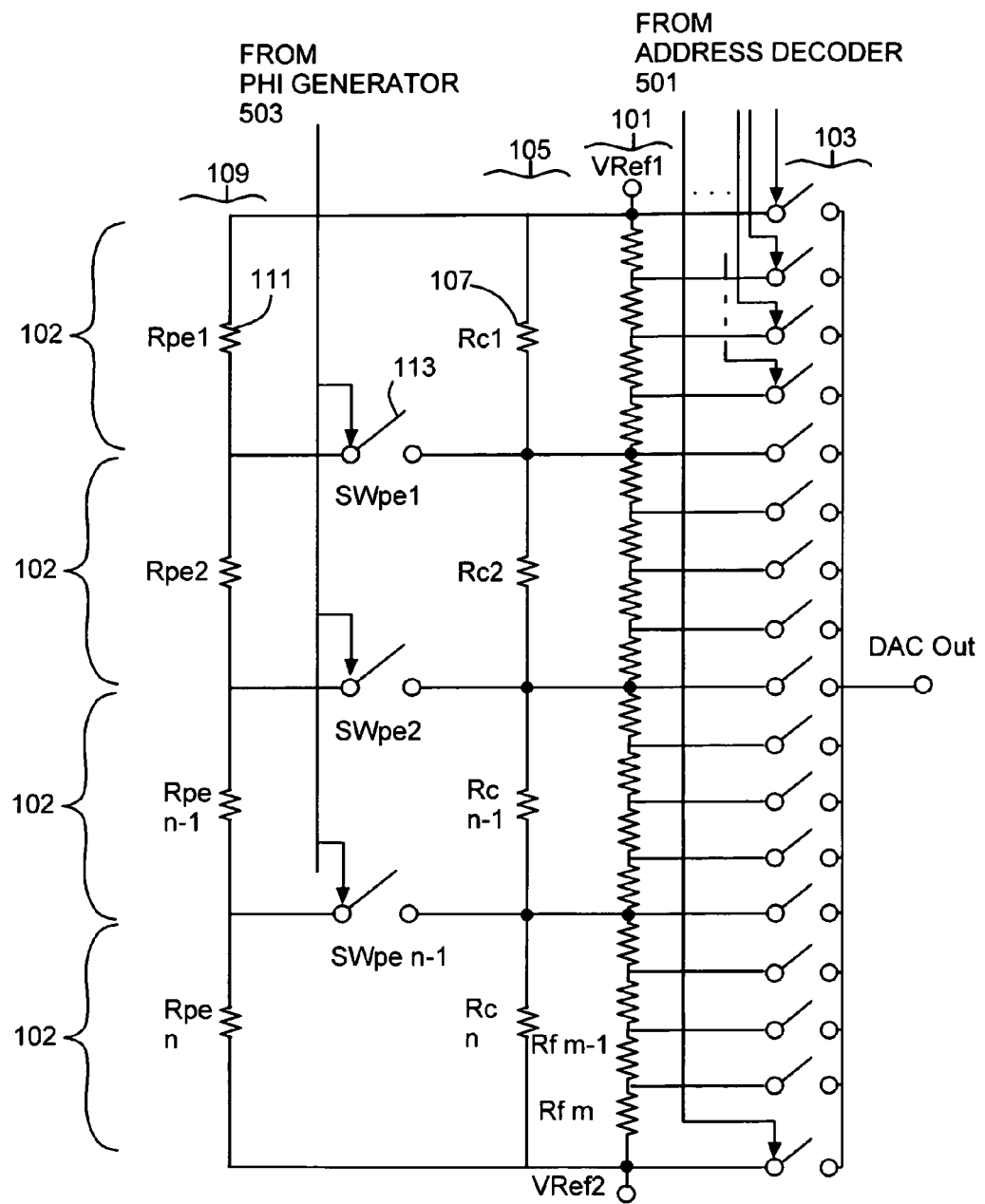
FIG. 3 shows analog voltage generation circuitry of the system of FIG. 1 in more detail.

FIG. 2 shows digital control circuit 500, shown in FIG. 1, in more detail. Digital control circuit 500 includes an address decoder 501, a PHI generator 503, and a clock 505. In operation, addresses (A(0) through A(m)) are sent to the address decoder 501. When the clock 505 sends a timing signal to the address decoder 501, the address decoder 501 decodes the address into select lines that control switches 103 (of FIG. 3), closing the switch 103 for the address provided at the address decoder 501. The clock 505 also provides a timing signal to the PHI Generator 503 that provides a PHI clock signal to the SWpe 113 switches (FIG. 3). PHI Generator 503 may operate as a controller receiving the address, and inputs from control lines in addition to previous state and address data to selectively generate the PHI clock signal only when selected control and address conditions exist.

FIG. 3 shows voltage generation circuit 20, shown in FIG. 1, in more detail. Circuit 20 includes a first path 101 having a network of fine resistors (Rf), "m" number of resistors in series between a first reference voltage (VRef1) and a second reference voltage (VRef2). The network of fine resistors in the first path 101 is connected at nodes between the fine resistors to switches 103 of a multiplexor (MUX) or a number of MUX type devices. The network of fine resistors is divided into "n" number of segments 102. In the illustrated embodiment, the segments 102 include four fine resistors from the network of fine resistors in the first path 101, but other embodiments may include other numbers of fine resistors. A second path 105 is connected in parallel to the first path 101. Each segment 102 includes a coarse resistor (Rc) 107 in the second path 105 connected in parallel to the network of fine resistors in the segment 102. Other embodiments may include other numbers of coarse resistors. A third path 109 is also connected in parallel with the first path 101. The third path 109 includes a pre-emphasis resistor (Rpe) 111 and a switch (SWpe) 113 in series with Rpe 111 connected to a node of the first path 101. The n segment 102 portion of third path 109 may not include the SWpe 113.

Referring to FIG. 3, the Rf resistors are selected such that the resistance of the first path 101 is higher than the resistance of the third path 109. Each of the Rpe 111 resistors are a similar resistance and may be set to a value much smaller than the Rf resistors of first path 101. In PHI operation, the SWpe 113 switches are controlled by a signal generated by PHI generator 503, to open and close the SWpe 113 switches at intervals. When the SWpe 113 switches are closed, the Rpe 111 resistors are in parallel with the Rf resistors in the first path 101. The switches are closed during a first portion of the DAC access cycle and opened in a second portion of the DAC access cycle. When the SWpe 113 switches are closed, the DAC initially exhibits very low resistance following an address change. The lower resistance effects a faster transition time to an output voltage close to the newly selected output voltage (as determined by the new address). At a later point in time, when the transition is largely complete, the SWpe 113 switches are opened and the DAC stabilizes to its final output value. The DAC then exhibits a high LSB resistance that limits noise injection and other parasitic effects. Transitioning at a higher speed may be realized if the components in the third path 109 quickly settle the DAC to within several LSBs of the final addressed value.

Figure 4:
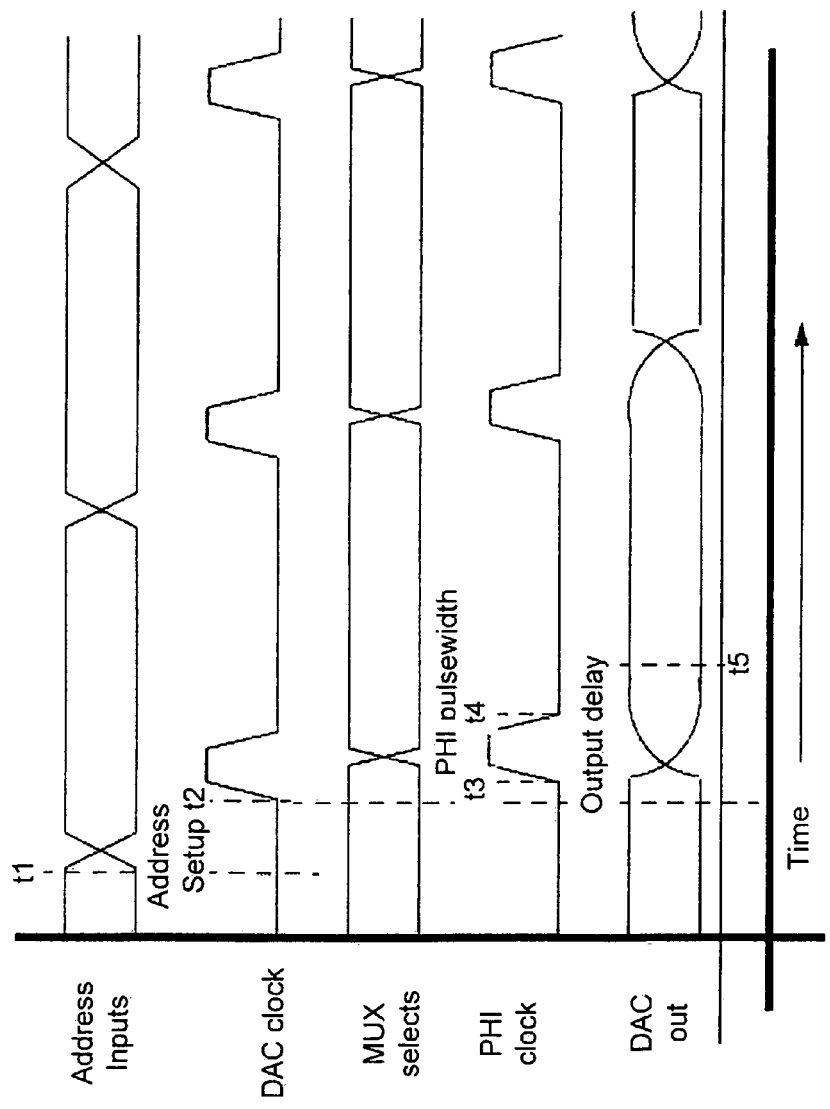
FIG. 4 is a timing diagram showing a relationship between events in an exemplary system.

FIG. 4 shows an exemplary timing diagram of the operation of the DAC system 100. Address inputs are received at a time t1. A DAC clock signal is received at a time t2. When the DAC clock signal is received, the new address is decoded and subsequently MUX selections to close one of the switches 103 (based on the received decoded address) are made. At a time t3, a PHI (early cycle voltage buffering) clock signal is received. The PHI clock signal is operative to close all of the SWpe switches 113 of DAC system 100. The DAC out shows the transition time for the selected output voltage at the DAC out node respondent to MUX selections for the switches 103. While SWpe switches 113 are closed, the low resistance allows a fast transition of DAC Out to approximately the selected output voltage value as determined by the address. The PHI pulse width ends at a time t4 opening SWpe switches 113. Once the SWpe switches 113 open, transition of DAC out to the selected output voltage is completed through the higher LSB resistance at time t5. The DAC clock signal and the PHI clock signal may be received from one or more clocks. The PHI pulse width is based on the output delay time for the DAC circuit and may be adjusted according to designs of the DAC. In the case that the DAC delay time is long (for example, due to variations in the manufacturing process or in the supply voltage), a longer PHI pulse is desired in order to allow a longer settling time with the increased resistance of the Rpe resistor network 109. Similarly, in the case that the DAC delay time is short, a shorter PHI pulse can be employed without affecting the ability of the DAC to settle to its final value.

Figure 5:
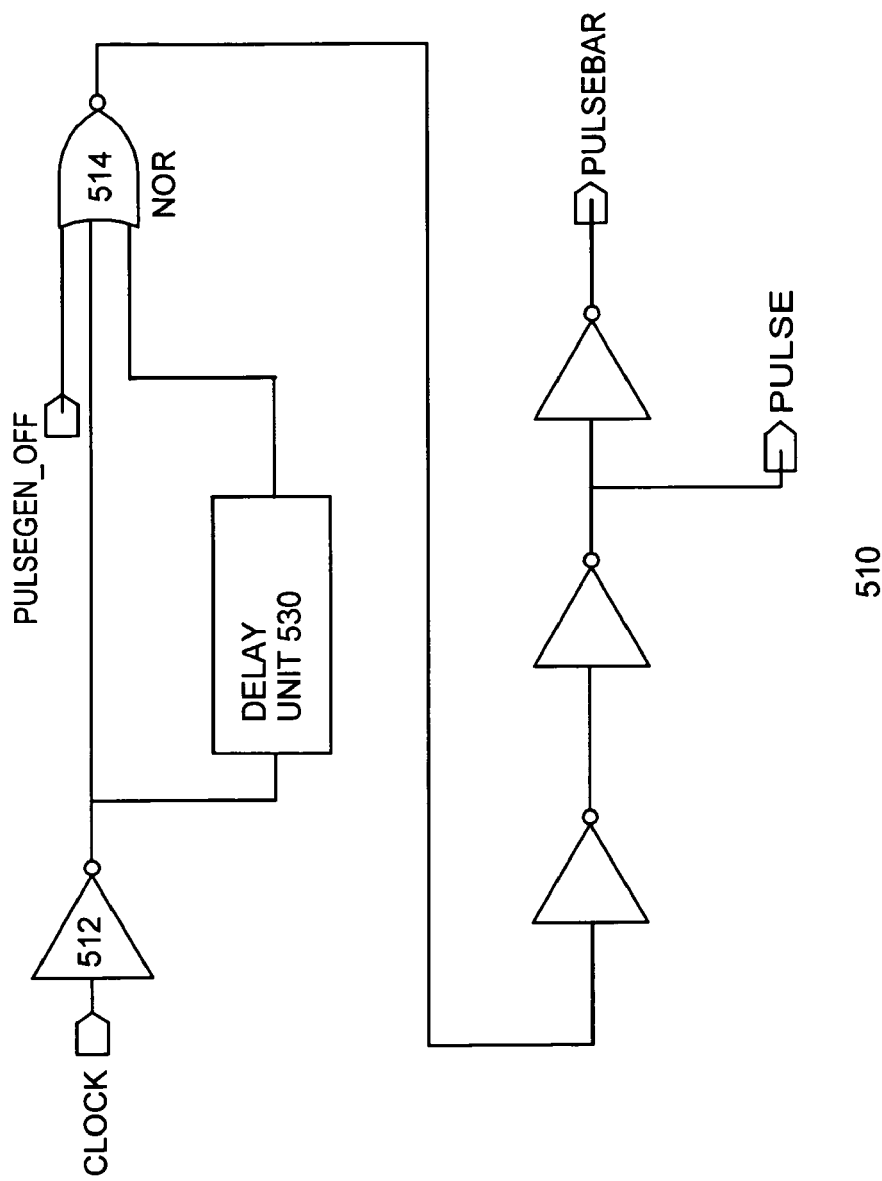
FIG. 5 shows an aspect of the circuitry shown in FIG. 2 in more detail.

FIG. 5 shows an output stage 510 of PHI generator 503. The width of output PULSE is a function of the delay through delay unit 530.

Figure 6:
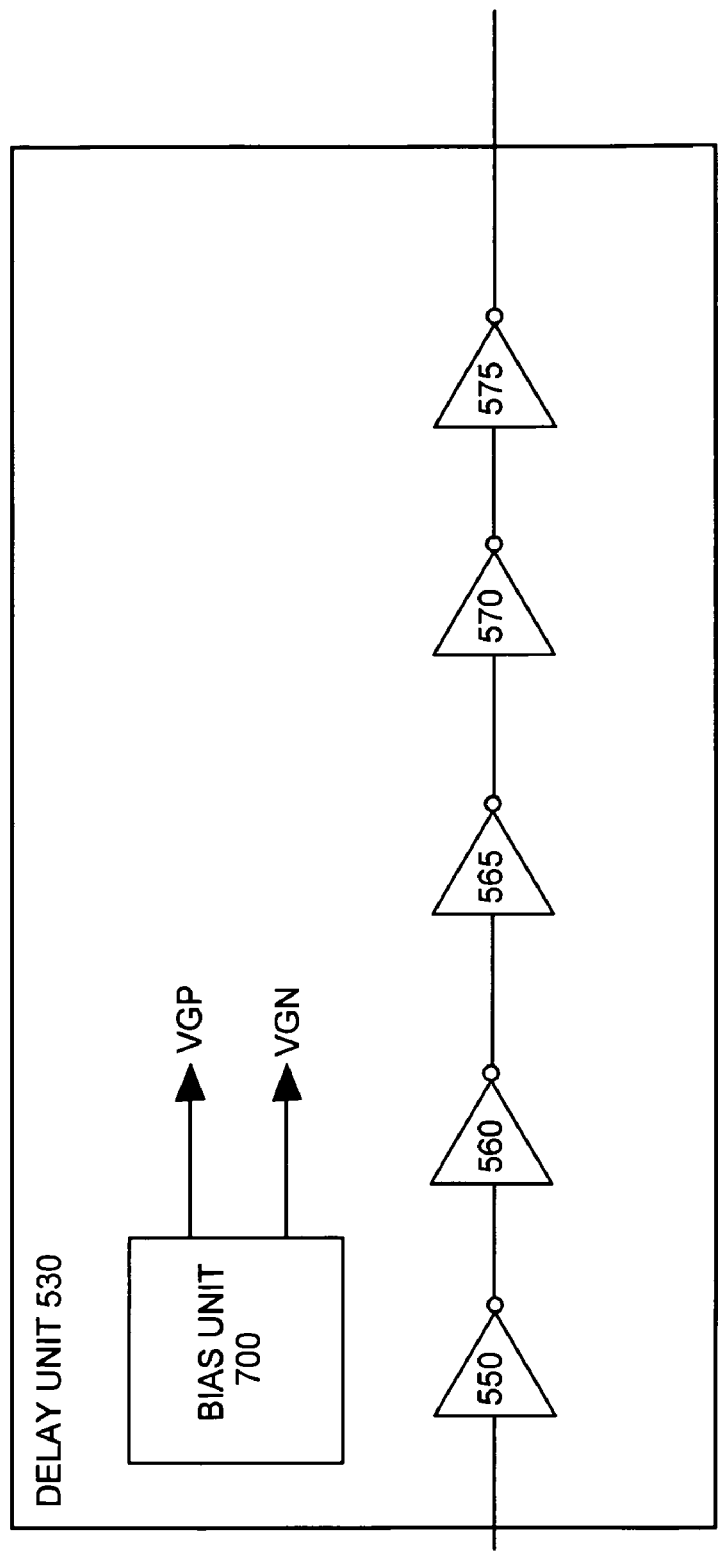
FIG. 6 shows an aspect of the circuitry shown in FIG. 5 in more detail.

FIG. 6 shows delay unit 530 of output stage 510 in more detail. Inverters 550, 560, 565, 570, and 575 are connected in series. Bias unit 700 generates the voltages VGP and VGN, as described in more detail below.

Figure 7:
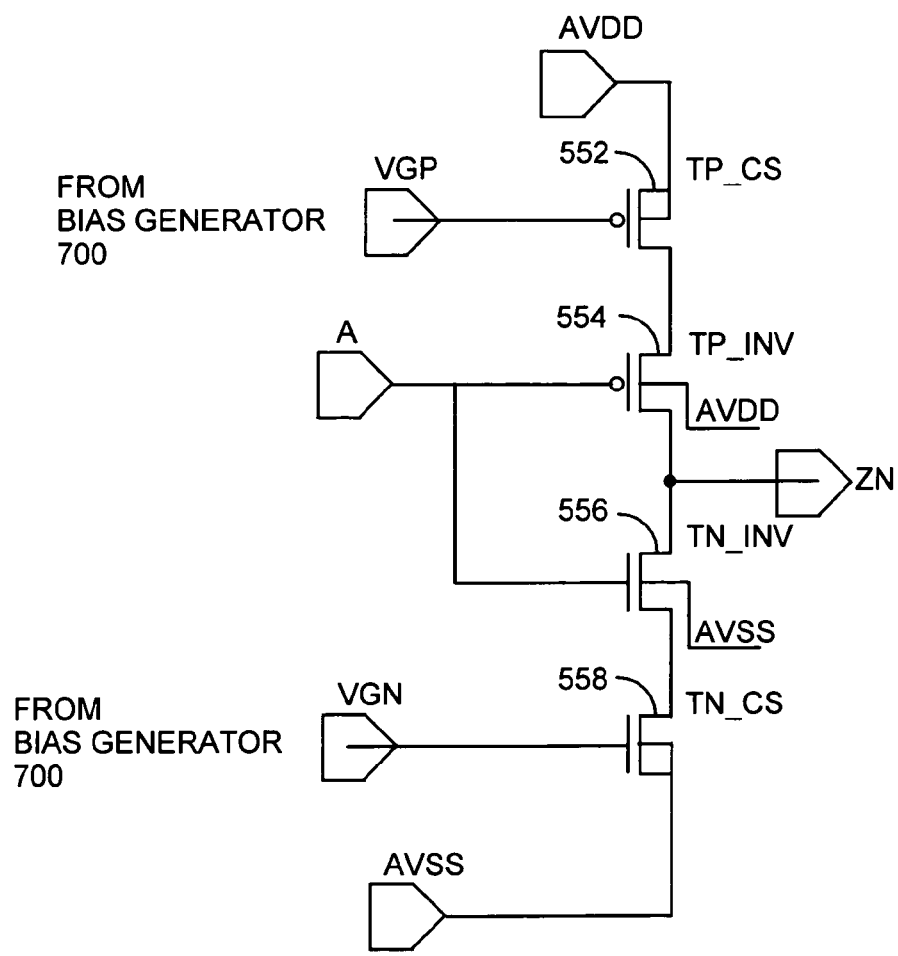
FIG. 7 shows an aspect of the circuitry shown in FIG. 6 in more detail.

FIG. 7 shows inverter 550, of FIG. 6, in more detail. Inverter 550 includes an input A connected to the gate of PFET 554 and to the gate of NFET 556. The current through PFET 554 and NFET 556 is limited by PFET 552 and NFET 558. The gate of PFET 552 is connected to an output VGP of bias generator 700, and the gate of NFET 558 is connected to an output VGN of bias generator 700.

Each of inverters 560, 565, 570, and 575 has the same structure as that of inverter 550.

Figure 8:
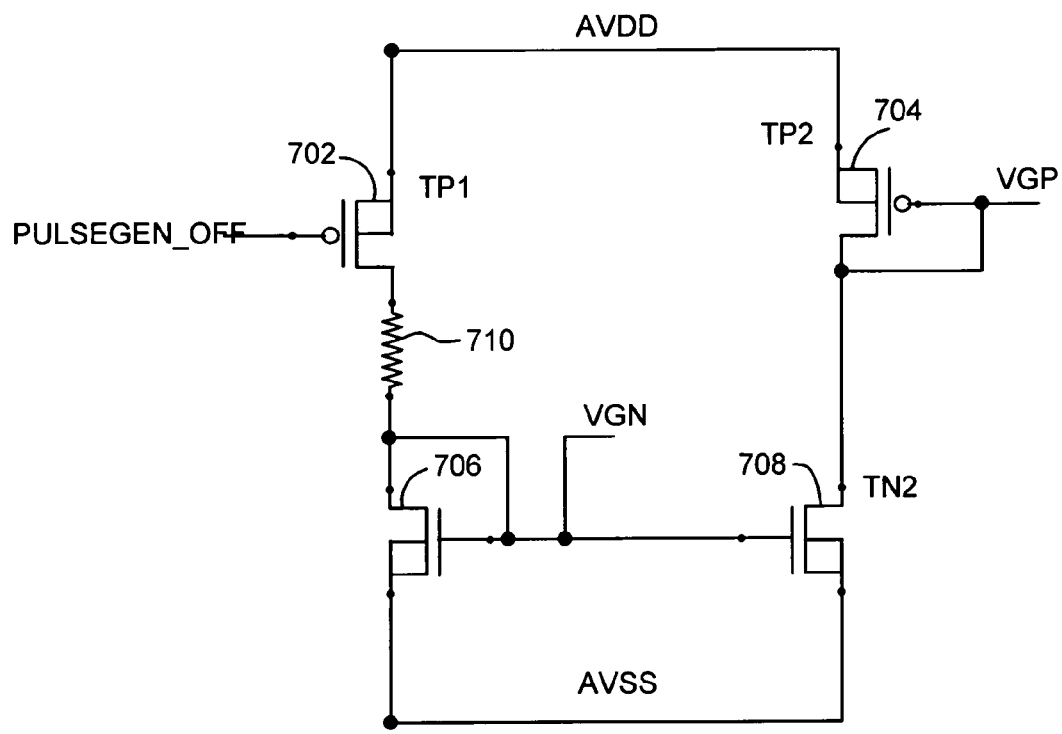
FIG. 8 shows an aspect of the circuitry shown in FIG. 6 in more detail.

FIG. 8 shows bias unit 700 of delay unit 530 in more detail. Although resistor values may vary between manufactured lots, the ratio of the value of bias resistor 710 to the value of resistors in voltage generation circuit 20 (FIG. 3) can be kept approximately constant, excepting process mismatches, which are negligibly small (often <1%, depending on resistor size). An exemplary design process selects the nominal resistor values, and therefore selects the ratio, in conjunction with the size of the NMOS/PMOS devices in inverter 550 in order to achieve the pulse width required to meet the circuit specifications (for example, DAC resolution and delay time).

Thus, circuit 550 is effectively an inverter with series PFET 552 and NFET 558 acting as current sources. The gate bias of these current sources is set by circuit 700, including resistor 710 in series with a diode-connected NFET 706 to set a gate bias for NFET 558, and a current mirror with a diode-connected PFET 704 to set a gate bias for the PFET 552.

Thus, an exemplary pulse generator circuit includes a delay path implemented by a chain of inverters with current levels that are controlled by a resistor-diode bias circuit. The propagation delay through the chain provides a pulse width correlated with the resistor value of resistor 710 and supply voltage of the resistor-diode bias circuit. Because of this correlation, the pulse width compensates for the speed variation with process, voltage, and temperature (PVT) of the resistors of voltage generation circuit 20. A higher resistor value of resistor 710 results in a slower RDAC and a wider pulse.

Figure 9:
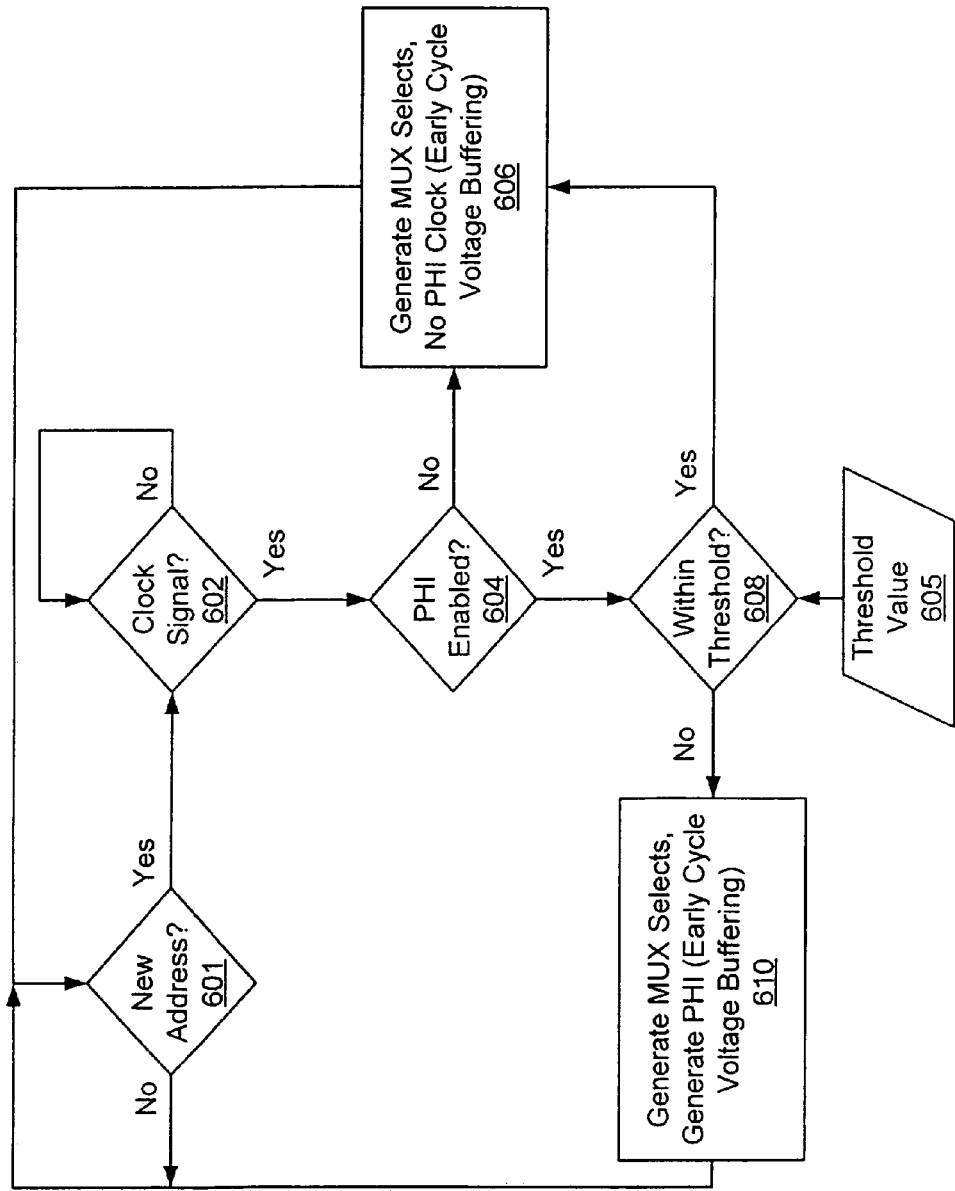
FIG. 9 is a flow chart of an exemplary method for controlling a DAC system.

FIG. 9 shows a block diagram of an exemplary method of operation of the control portion 500. Referring to FIG. 9, it is determined whether a new address is received in block 601. Once a new address is received, it is determined whether a clock signal is received in block 602. In block 604 it is determined whether the PHI is enabled. If the PHI is not enabled, the address decoder 501 (of FIG. 2) generates MUX selections and the DAC system 100 converts the digital signal to an analog signal in block 606. If the PHI is enabled, the PHI generator 503 determines whether the new address is within a threshold value 605 at block 608. If the new address is within the threshold value 605, the address decoder 501 (of FIG. 2) generates MUX selects and the DAC system 100 converts the digital signal to an analog signal without activation of the PHI clock (early cycle voltage buffering) in block 606. If the new address is outside the threshold value 605, the PHI clock is generated by PHI Generator 503 (of FIG. 2) activating SWpe switches and the address decoder 501 (of FIG. 2) generates MUX selections and the DAC system 100 converts the digital signal to an analog signal using early cycle voltage buffering in block 610.

Since some address changes may be between relatively few bits, the use of PHI may not be desired. Thus, the threshold value 605 may be used to determine whether PHI should be used for a particular new address. In block 608 the new address may be subtracted from a previous address. The result is compared to the threshold value 605. If the result is within the threshold value, the difference in the addresses is not great enough to use PHI. If the result is outside of the threshold value 605 PHI may be used. In the embodiment of FIG. 9, PHI (early cycle voltage buffering) may be enabled or disabled by a control signal as determined by block 604. Enabling of PHI allows the DAC system 100 to provide higher performance conversion while disabling PHI, allows reduction in power consumption when higher performance is not desired.

Thus, an exemplary method includes receiving a new address, determining whether a difference between the new address and a prior address is greater than a threshold value, and generating a switching device selection signal responsive to determining that the difference between the new address and the prior address is greater than the threshold value.

Figure 10:
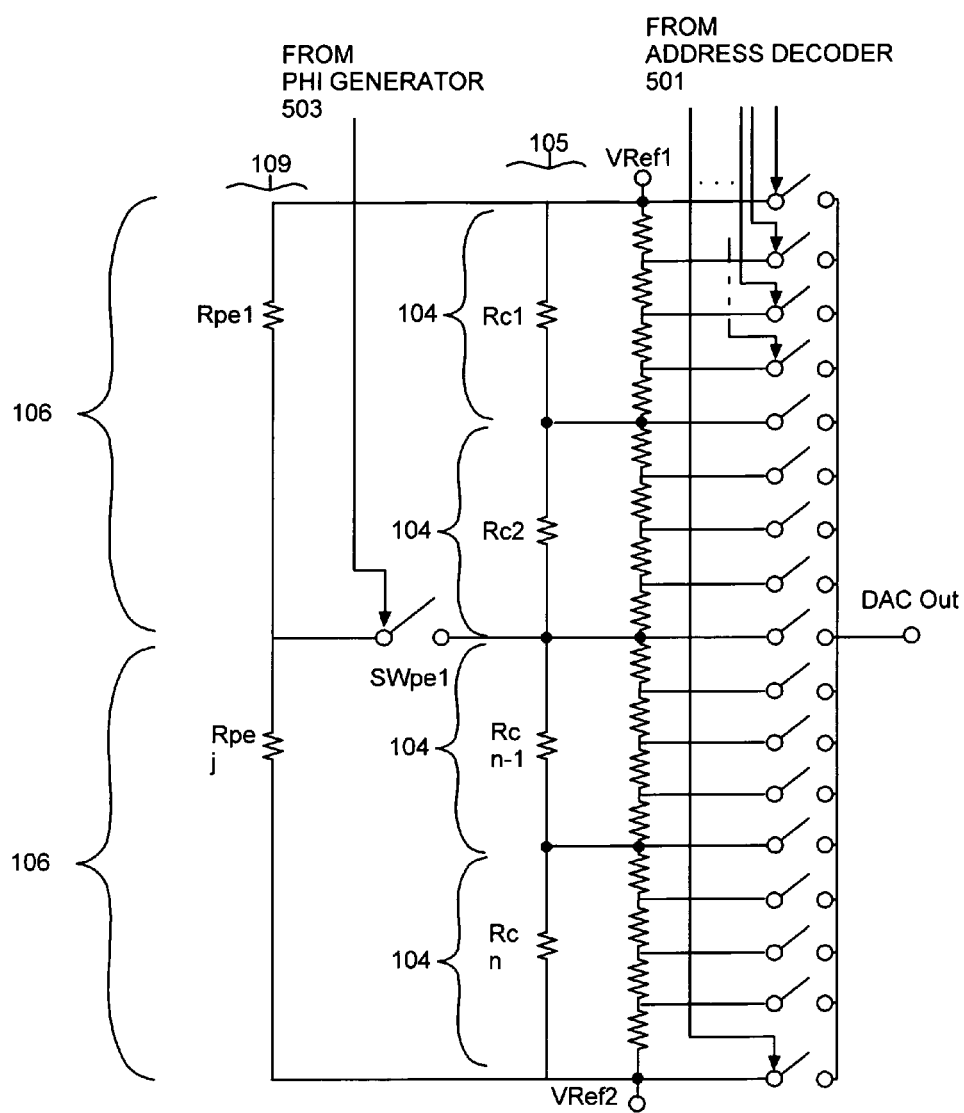
FIG. 10 illustrates an alternate exemplary embodiment of a DAC system.
Figure 14:
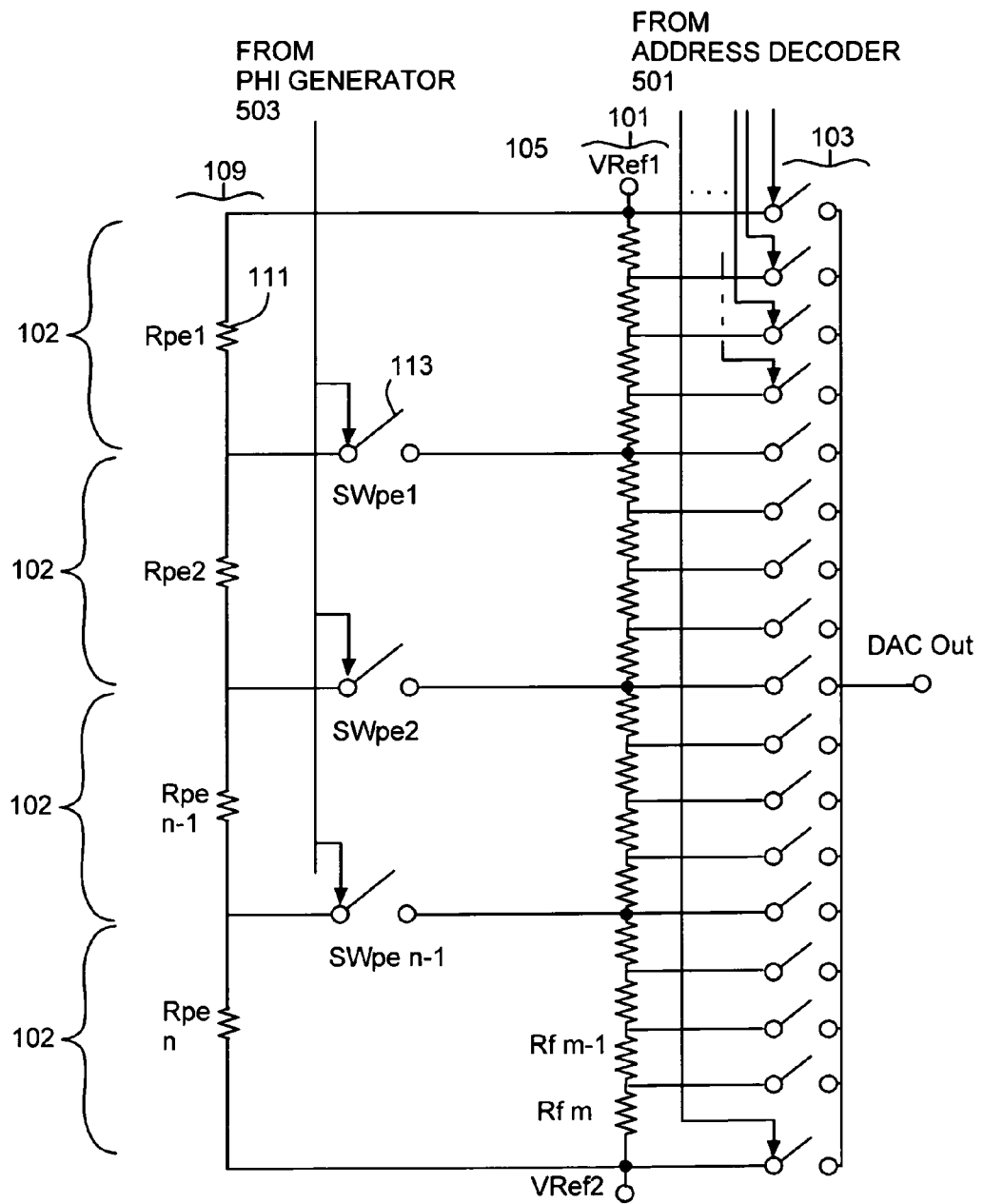
FIG. 14 illustrates another alternate exemplary embodiment of a DAC system.

FIG. 10 illustrates an exemplary alternate embodiment of the DAC system 100 having different segment sizes for the second path 105 (including segments 104) and the third path 109 (including segments 106). The DAC system 100 may also only include the third path 109 and not include the second path 105. An embodiment of a DAC system 100 having a third path 109 without the second path 105 is illustrated in FIG. 14.

Figure 11:
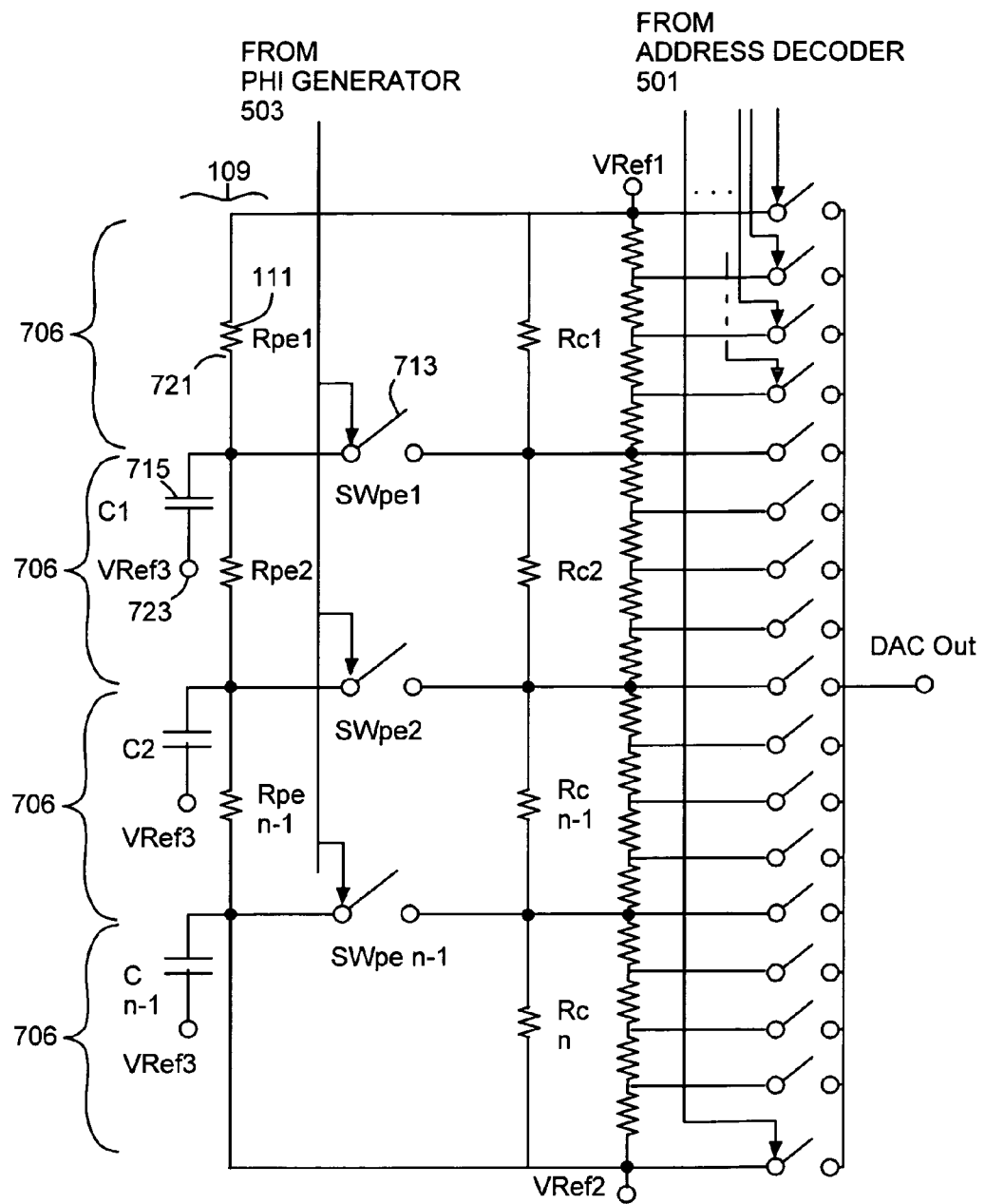
FIG. 11 illustrates another alternate exemplary embodiment of a DAC system.

FIG. 11 illustrates an alternate embodiment of the DAC system 100. In FIG. 11 the third path 109 includes a capacitor 715 in each segment 706, a second resistor first node 721 (of the second resistor Rpe1 111) and a third reference voltage, VRef3 723. The third reference voltage, VRef3 723 may be a ground voltage or any other applicable voltage value. The capacitor 715 acts to store a charge such that when the SWpe 113 switch is closed the transition time for the selected output voltage is further reduced. Capacitor 715 is charged to the desired voltage value as determined by the voltage division of Rpe in the third path 109 when switch SWpe 133 is open, and provides a charge reservoir to improve the transition time of the DAC out when the switch SWpe 113 is closed. Capacitor 715 is operative to allow the resistance value of Rpe of segment 706 to be larger than would otherwise be required to provide the necessary performance, and conserve power consumed by the third path 109. The n segment 706 portion of the third path 109 may, in some embodiments, not include a capacitor.

Figure 12:
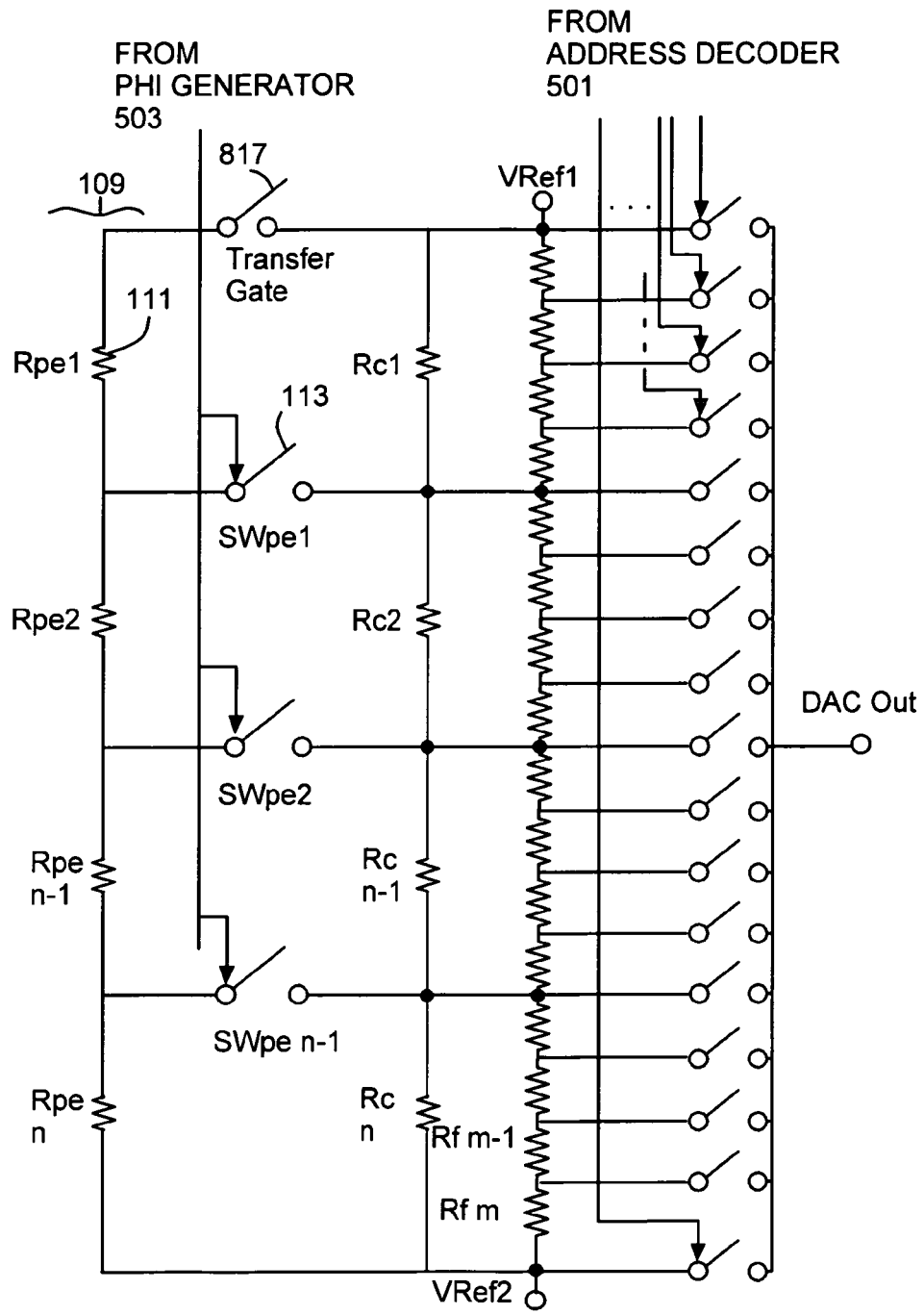
FIG. 12 illustrates another alternate exemplary embodiment of a DAC system.
Figure 15:
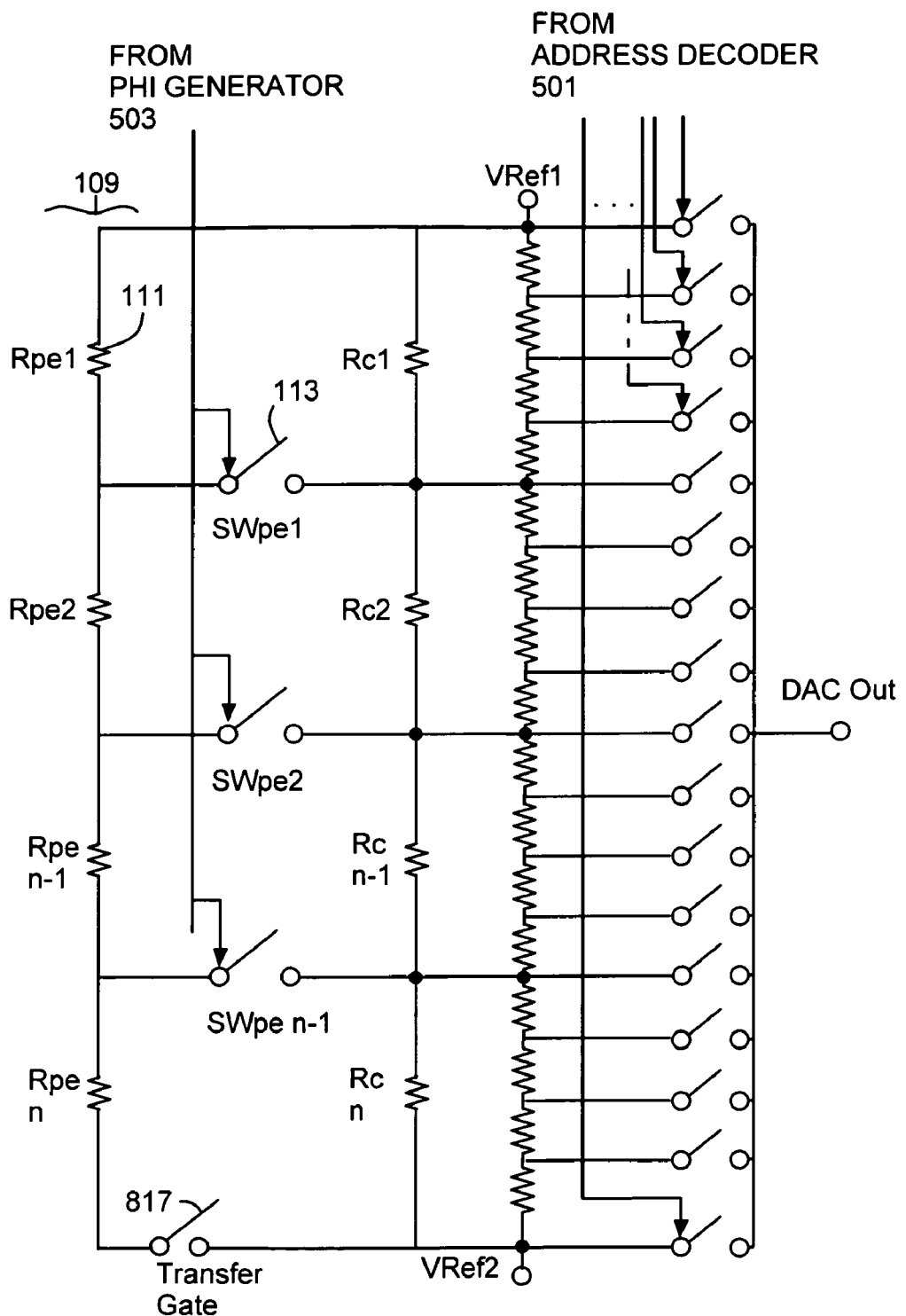
FIG. 15 illustrates another alternate exemplary embodiment of a DAC system.

FIG. 12 illustrates an alternate embodiment of the DAC system 100. In FIG. 12, the third path 109 includes a transfer gate (switch device) 817 between VRef1 and the first resistor 111 in the third path 109 (Rpe1). The transfer gate 817 may be controlled by the PHI generator 503 (of FIG. 5). The transfer gate 817 is operative to conserve power consumed by the third path 109. The transfer gate 817 may be closed to power the third path 109 prior to closing the SWpe 113 switches. Gating the third path 109 limits the DC current consumed by the third path 109 to a designed portion of a cycle of the DAC. The transfer gate 817 may alternatively be connected between VRef2 and Rpen, or multiple transfer gates 817 could be used. An alternative embodiment of the DAC system 100 having the transfer gate 817 may alternatively be connected between VRef2 and Rpen is illustrated in FIG. 15.

Figure 13:
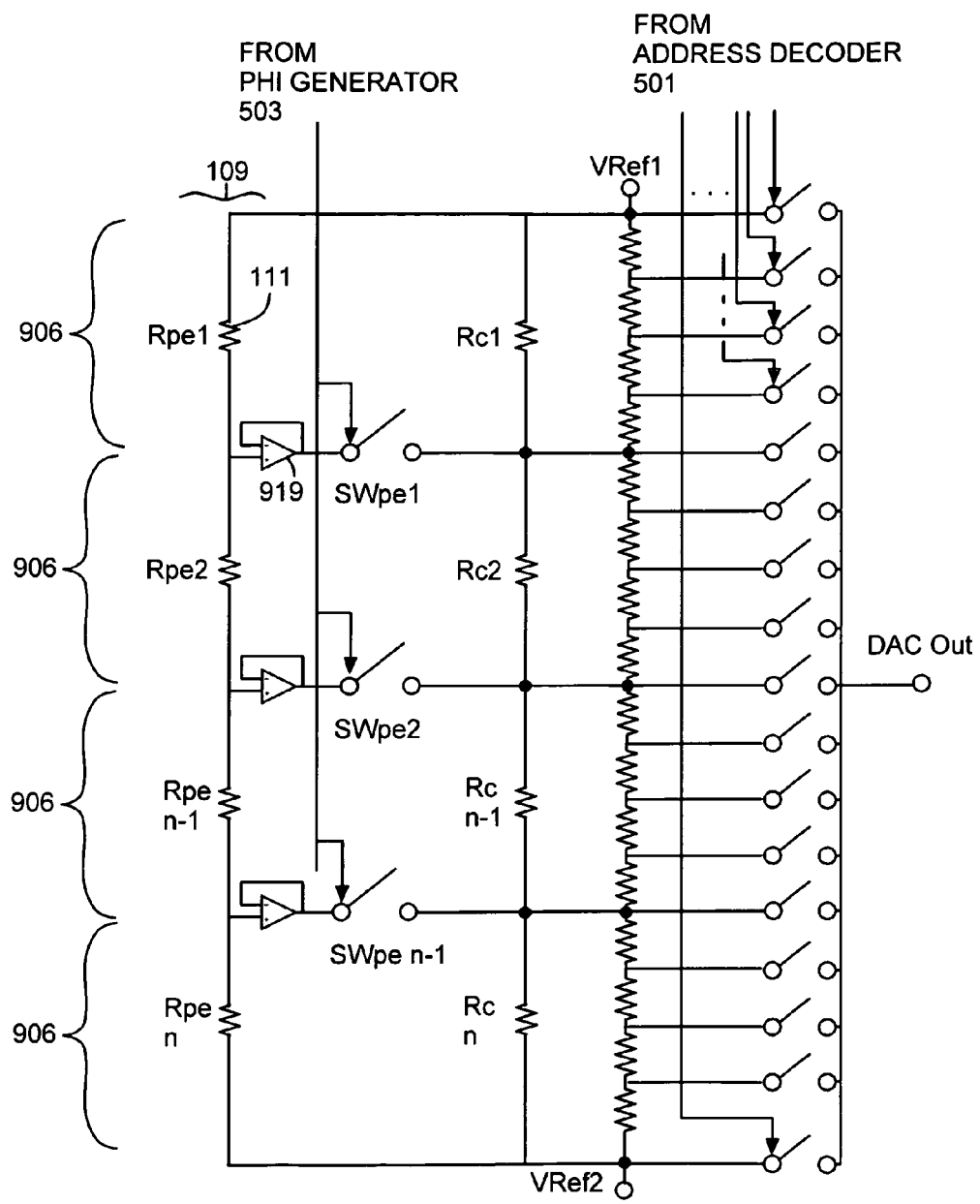
FIG. 13 illustrates another alternate exemplary embodiment of a DAC system.
Figure 16:
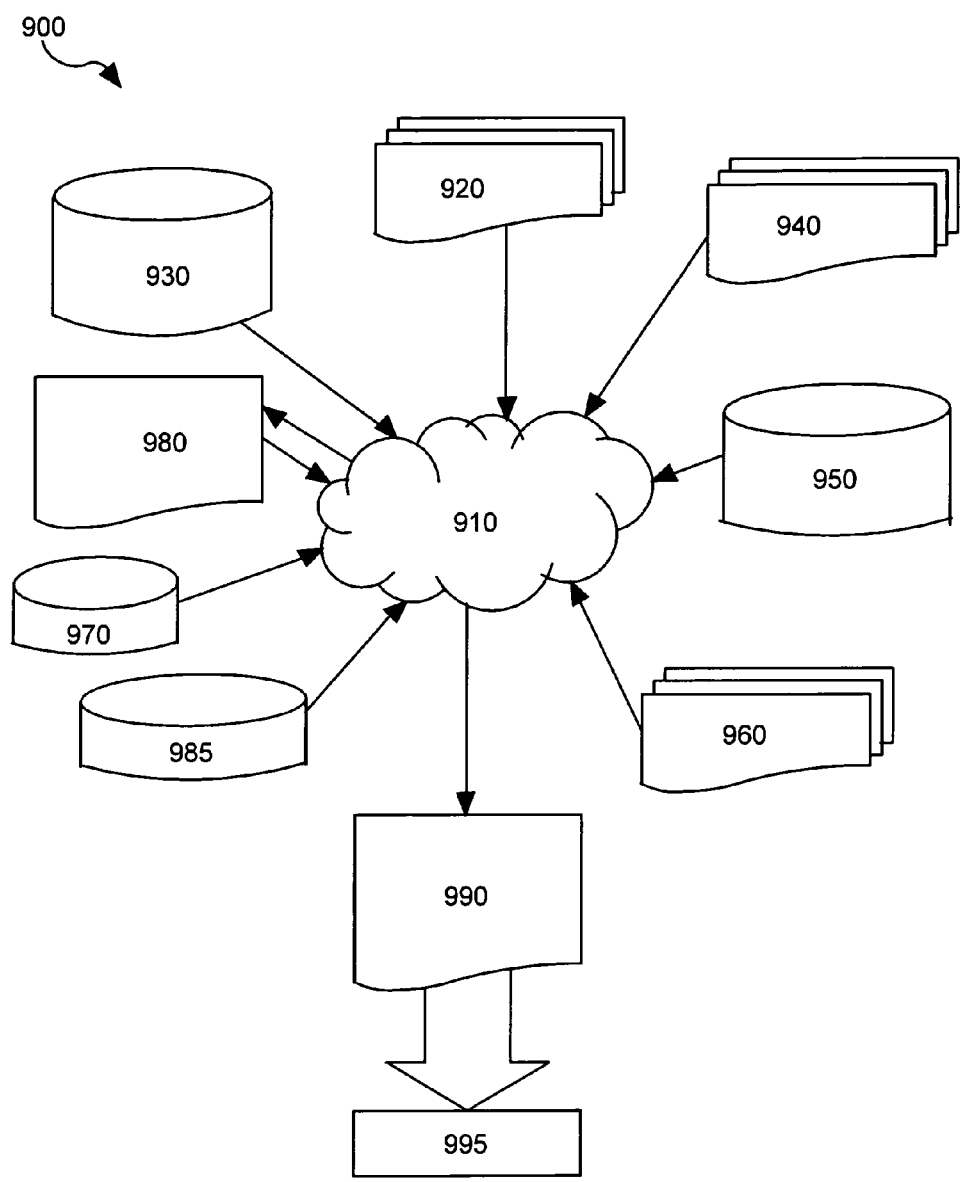
FIG. 16 is a flow diagram of a process used in semiconductor design, manufacture, and/or test.

FIG. 13 illustrates an alternate embodiment of the DAC system 100. In FIG. 13, the third path 109 includes an amplifier 919 in each segment 906. The amplifier 919 acts to amplify a signal on the third path 109 and allows the resistance of the Rpe resistors to be increased to conserve power in the third path 109. The embodiment of FIG. 13 illustrates and operational amplifier, however other amplification methods may be used FIG. 16 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-15 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1-15. Design process 910 preferably synthesizes (or translates) an embodiment of the invention as shown in FIGS. 1-15 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of is not limited to any specific design flow.

Design process 910 preferably translates an embodiment of the invention as shown in FIGS. 1-15, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

What is claimed is:

1. A design structure embodied in a machine readable medium for designing, manufacturing, or testing, the design structure comprising a digital to analog converter on an integrated circuit, the digital to analog converter comprising:

an output node;

a first plurality of resistors coupled in series to receive a first reference voltage and a second reference voltage, the first plurality of resistors having a first resistance;

an array of first switches, each first switch being coupled between the output node and a respective resistor of the first plurality of resistors;

a second plurality of resistors coupled in series to receive the first reference voltage and the second reference voltage, the second plurality of resistors having a resistance lower than the first resistance;

a control unit including a resistor, the control unit configured to generate a pulse having a width that is an increasing function of the resistor value; and an array of second switches, each second switch having a control input responsive to the pulse, and a current path coupled between a respective node in the second plurality of resistors and a respective node in the first plurality of resistors, each respective node in the first plurality of resistors being configured to receive a voltage greater than the first reference voltage and less than the second reference voltages.

* * * * *